United States Patent [19]
Divisek et al.

[11] 3,974,050
[45] Aug. 10, 1976

[54] METHOD OF AND APPARATUS FOR PROCESSING THE SURFACE OF BODIES

[75] Inventors: Jiri Divisek; Wolfgang Faul; Bertel Kastening, all of Julich, Germany

[73] Assignee: Kernforschungsanlage Julich Gesellschaft mit beschrankter Haftung, Julich, Germany

[22] Filed: Mar. 17, 1975

[21] Appl. No.: 559,339

Related U.S. Application Data

[63] Continuation of Ser. No. 296,549, Oct. 11, 1972, abandoned.

[30] Foreign Application Priority Data
Oct. 12, 1971  Germany............................ 2150748

[52] U.S. Cl............................ 204/129.6; 204/129.7; 204/263; 204/275
[51] Int. Cl.²....................... B23P 1/00; B23P 1/02; B23P 1/12
[58] Field of Search....... 204/129.6, 129.65, 129.70, 204/224 R, 129.1, 275, 276, 273, 263

[56] References Cited
UNITED STATES PATENTS

| | | | |
|---|---|---|---|
| 3,208,923 | 9/1965 | Feiner et al...................... | 204/129.6 |
| 3,409,534 | 11/1968 | Andrews et al.................. | 204/129.6 |
| 3,523,834 | 8/1970 | Hewins.............................. | 204/273 |
| 3,589,996 | 6/1971 | Chu.................................. | 204/129.6 |
| 3,637,468 | 1/1972 | Icxi.................................. | 204/224 R |
| 3,704,220 | 11/1972 | Ashworth......................... | 204/224 R |

Primary Examiner—T. M. Tufariello
Attorney, Agent, or Firm—Walter Becker

[57] ABSTRACT

Method of and apparatus for processing the surface of bodies, especially of electrically non-conductive material. A body is brought into contact with an electrolyte liquid, e.g. by immersing the body; simultaneously the surface to be processed contacting by means of electric conductors continuously or temporarily a portion only of the surface to be processed in contact with an electrode of dimensions corresponding to the surface to be processed.

12 Claims, 3 Drawing Figures

U.S. Patent   Aug. 10, 1976   3,974,050
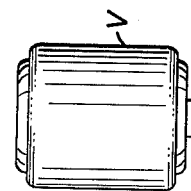
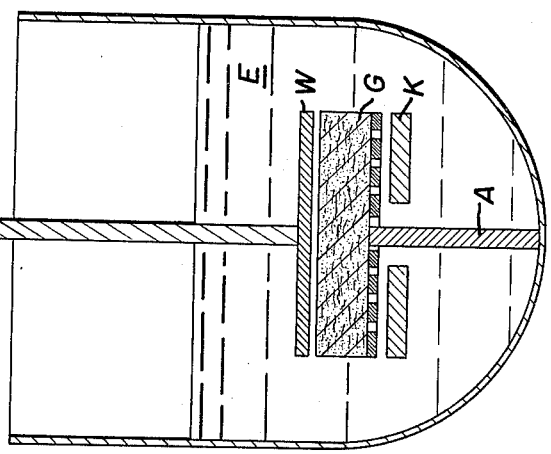
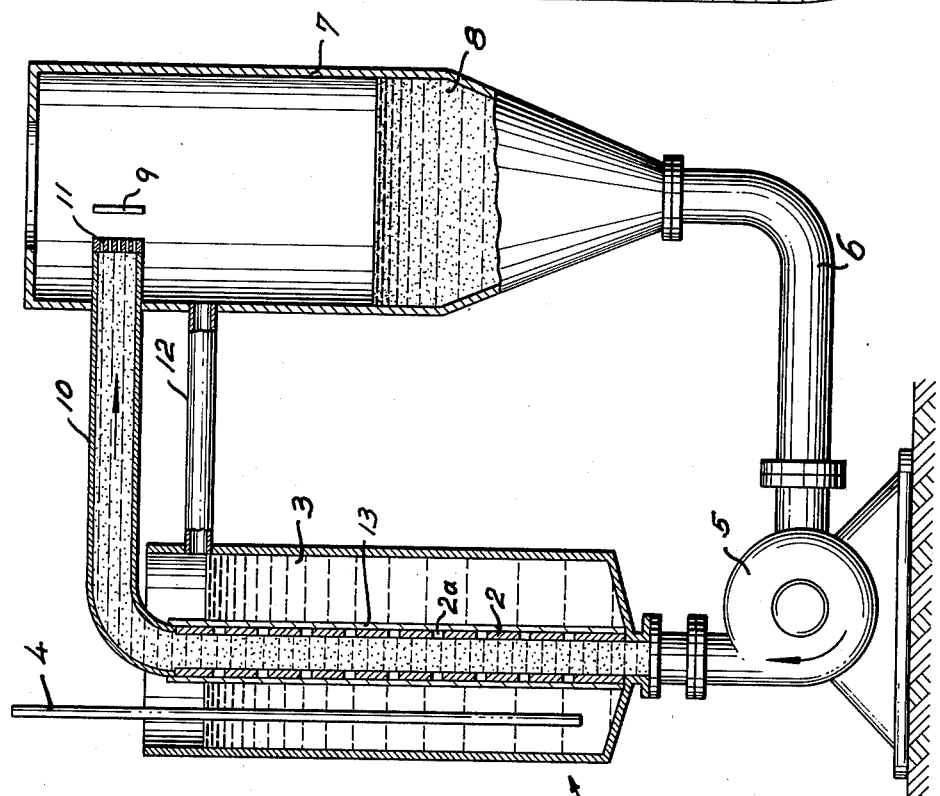
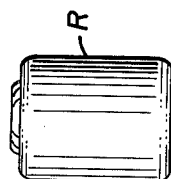
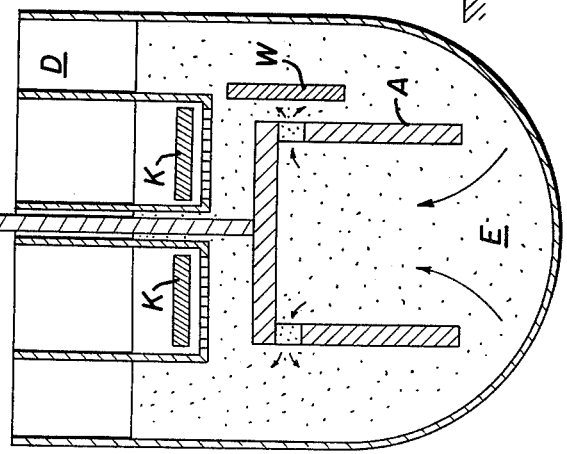

METHOD OF AND APPARATUS FOR PROCESSING THE SURFACE OF BODIES

This is a continuation of application Ser. No. 296,549, filed Oct. 11, 1972, and now abandoned.

The present invention relates to a method of electrochemically processing the surface of solid bodies, especially of electrically nonconductive material, and also concerns a device for practicing said method.

A chemical processing or machining of the surface of solid bodies is necessary, particularly when a metallic layer is applied to a body, for instance, a foil of insulating synthetic material, and when said metallic layer is not intended completely to cover the surface of the body formed of synthetic material.

Bodies of synthetic materials, especially foils which are partially provided with a metallic coat or the like may consist, for instance, of plates of foils which are provided with tracks of electric conductors intended for circuits. The manufacture of foils or plates carrying such electric conductors has heretofore been effected by partially chemically eliminating metal surfaces deposited on plates or foils of synthetic material. To this end acid hydrogen peroxide solutions were applied to the parts to be eliminated. The drawback of this method, however, consists in that valuable chemicals as, for instance, hydrogen peroxide and the respectively employed acids were used. Moreover, the dissolved metal was absorbed by the caustic solution and could be regained only by special methods, for instance, by electrolysis.

It is, therefore, an object of the present invention to provide a device for and method of electrochemically processing or machining the surface of solid bodies, especially of bodies of electrically nonconductive material with a metallic coating or layer practically without losses in the materials necessary for the reaction, not even in the metal which is employed as metallic coat.

These and other objects and advantages of the invention will appear more clearly from the following specification, in connection with the accompanying drawing, diagrammatically illustrating a device according to the present invention.

The method according to the present invention is characterized primarily in that the solid body, the surface of which is to be processed, is brought into contact with a electrolytic fluid through which current passes. Alternatively the solid body is immersed into the electrolytic fluid while simultaneously the surface to be processed is brought into contact with the electrode suitable for the processing of the respective surface, by means of electric conductors, continuously or temporarily contacting only a portion of the surface to be processed at a magnitude corresponding to the extension of the surface being processed. In this connection, especially when making electric conductors for synthetic plates or foils carrying circuits, in other words, for partially removing a portion of a surface formed by a metallic layer and pertaining to a body of nonconductive material, it is expedient that that portion of the surface which is to be protected against removal of the metallic layer be covered prior to the insertion of the solid body into the electrolyte fluid by means of an insulating lacquer layer corresponding to the remaining portion of the metallic layer. It has been found that foils or plates prepared according to the method of the invention with electric conductors thereon meet very high requirements. The sharpness of the contour of the part from which a portion was electrochemically removed was so high, in view of the lack of a lateral insufficient etching of the covering lacquer layer as it occurred with heretofore known methods, that the conductor with a very small cross section remained firmly connected with the foil over great lengths.

A very advantageous device for practicing the method according to the invention consists in that the electrolytic liquid between the electrode intended for the processing on one hand, and the surface to be processed of the solid body on the other hand, contains floating movable practicle acting as electric charge carriers. This means that in this instance the movable electric charge carriers serve for conveying electric charges which they have received when contacting the anode, to the surface being processed of the solid bodies when the electric charge carrier particle impacts upon the surface to be processed. As charge carriers there may be employed, for instance, graphite powder or also small bodies of insulating material which are coated with a metallic layer. In order to keep the charge carrier particles in motion, it has been found expedient to connect the electrode provided for the electrochemical processing of the surface of the solid body, and/or the solid body with a vibration device known per se. Instead thereof, it may also be advantageous to mount the electrode intended for the processing so as to be rotatable about an axis and operatively to connect the electrode with a drive. Another possibility of bringing the charge carriers alternately into contact with the electrode intended for the processing and with the surface to be processed of the solid body consists in the provision of a pump for circulating the electrolyte, or in the provision of an agitating mechanism.

A further development of the invention for practicing the method according to the invention consists in that for purposes of establishing a contact between the electrode intended for the surface processing on one hand and the portion of the surface of the solid body being processed there is provided a connecting member of an absorbing or porous electrically conductive material. In case of need it is advantageous to make the electrode intended for the processing operation completely of a porous or absorbent electrically conductive material. The utilization of graphite felt or graphite fabric has proved particularly suitable in this connection. In order to increase the electrochemical effect, it is also in this instance, frequently advantageous to connect the electrode intended for the electrochemical processing of the surface of the solid body and/or the solid body to a standard vibration device. It may also be expedient to provide a pump for recirculating the electrolyte or an agitating mechanism may be provided in the electrolyte.

The application of the method of the invention and the device for practicing this method is advantageous in many respects because it completely avoids the formation of undesired by-products. The control of the course of reaction and of the turnover by the electrode potential is effected according to the invention with any desired position. By selecting suitable electrolytes and suitable materials for the electrode which serves for feeding the current to the solid body, the surface of which is to be processed, it is possible to adapt the method to the respective prevailing conditions. In particular, the reaction necessary for the processing can practically be carried out at any desired temperature and under various outer conditions. The above mentioned advantages of the method according to the invention are equally well realized when employing a device for practicing the method according to the invention, in which for purposes of the current transfer between the electrode and the solid body to be processed, movable charge carriers are provided in the electrolyte liquid.

A particular advantage of the method according to the invention consists in that the metal etched away during the process, especially when the metal consists of copper, is deposited on the electrode which is not employed for the processing of the surface of the solid body. This advantage can be realized by so connecting this electrode with a foil plate, or the like, covered with a thin electrically conductive layer that the etched-off metal is deposited on this foil or plate. If such foil or plate is partially covered by an insulating lacquer layer, the foil or plate will, for instance, be coated so as to form conductors for a circuit.

The advantages of the method according to the invention will become particularly evident from the following examples:

EXAMPLE 1.

As electrically conductive material between the electrode intended for the processing operation, on one hand, and the surface of the solid body on the other hand, there was employed graphite felt which when immersing into the electrolyte, sucks itself full with said electrolyte. The graphite felt was polarized anodically. The copper coated plate was subsequently after the copper surface, which is not to be dissolved, was covered up, pressed with etching resistant lacquer onto the felt. As electrolyte there was employed a 1-normal sulfuric acid with a content of 140 grams $CuSO_4$ per liter. The graphite felt was polarized to 1000 mV against a normally hydrogen electrode. In this connection, an anodic current density of approximately 250 m A/cm² was obtained. In all instances sharp contours of the copper tracks were formed which remained and were firmly connected to the body. The current utilization amounted practically to 100% exploitation.

EXAMPLE 2

Anode and cathode chambers of the electrolysis cell were separated by a diaphragm in order to prevent the discharge of the particles suspended in the anode chamber on the cathode. As suspended material, graphite powder was used. The current supply was effected by a compact graphite body forming the anode which was arranged at a slight distance from the copper coated plate of synthetic material is also to be processed. By rotating this graphite anode, at the same time the required movement of the suspended particles was obtained. As electrolyte there was employed a 1-normal sulfuric acid with a content of 140 grams of $CuSO_4$ per liter.

With an electrolyte volume of 80 ml in the anode chamber and an addition of 40 grams of graphite powder, with a polarization of +800 mV, a current density of 160 mA/cm² was obtained at 70°C. Also in this instance, sharp contours of the covered-up retained copper track were formed. The copper ions formed in this connection were again deposited in the cathode chamber at the same current density so that with unchanged suspension layer, also the electrolyte as a whole, did not undergo any change. The detaching period for a copper layer having a thickness of 35μ amounted to approximately 10 minutes. Also with this embodiment, the current exploitation amounted practically to 100%.

The method according to the present invention is advantageously practiced by a device as illustrated in FIG. 1 of the drawing, which comprises an electrolysis cell 1, having arranged therein a graphite anode 2 with bores 2a. Immersed in the electrolyte 3 in said cell 1 is a copper cathode 4. The cell 1 has its bottom connected to a pump 5 which is connected by a pipe 6 to the etching chamber 7 containing graphite powder suspension 8. The workpiece 9 to be processed is located in the etching chamber 7. The upper end of the graphite anode 2 communicates through a conduit 10 with a spray nozzle 11. Furthermore, there is an electrolyte overflow 12 provided, which leads from the etching chamber 7 to the electrolysis cell 1. It may also be mentioned that the graphite anode 2 is surrounded by a diaphragm 13.

FIG. 2 diagramatically illustrates a vibrator "V" as well as electrolyte "E" with a workpiece "W" suspended therein, together with an anode, "A" and cathode "K" and also graphite felt "G" therewith.

FIG. 3 diagramatically illustrates a mixing-stirring mechanism "R" together with a cathode "K", a workpiece "W" an anode "A" with a diaphragm "D" positioned with respect to electrolyte "E".

It is, of course, to be understood that the present invention is, by no means, limited to the particular examples and the device shown in the drawing, but also comprises any modifications within the scope of the appended claims.

What we claim is:

1. The method of removing selected portions of a layer of a conducting material on a non-conducting base, comprising in combination exposing said conducting material to an electrolyte which is substantially inert to said conducting material, establishing a difference in potential between anode and cathode poles which are spaced from said conducting material in said electrolyte, transferring electrical charges from said anode pole to discrete, electrically conducting charge carrier particles in the form of powdered material, said particles being maintained movable and in suspension in said electrolyte and prevented from contact with said cathode pole, and transferring charges from said carriers to said conducting material to form ions of said conducting material, so that ions of said conducting material move through said electrolyte toward said cathode pole.

2. The method in combination as claimed in claim 1, in which said electrical conducting particles are formed of insulating material coated with a metallic layer.

3. The method in combination as claimed in claim 2, in which the charge carrier material is in the form of charge carrier powder which is maintained in suspension in said electrolyte.

4. The method in combination as claimed in claim 1, in which said electrolyte is circulated past said anode pole and then to said workpiece.

5. The method in combination as claimed in claim 1, in which a shield is placed between said anode pole and said cathode pole to prevent said charge carrier particles contacting said cathode pole.

6. The method in combination as claimed in claim 1, in which said anode pole is hollow and said electrolyte carrying said charge carrier particles is circulated through said anode and past said workpiece, and a shield surrounds said anode pole to prevent said graphite particles moving to said cathode pole in said electrolyte.

7. The method in combination as claimed in claim 1, in which said anode pole is movable to produce motion of said electrolyte relative to said conducting material.

8. The method in combination as claimed in claim 1, in which said electrolyte is circulated past said anode pole and is sprayed on said conducting material.

9. The method in combination as claimed in claim 1, in which said ions from said conducting material may travel to said cathode pole to be deposited thereon.

10. An apparatus for removing surface material from a workpiece having a surface of conducting material, comprising in combination a liquid container having an electrolyte therein spaced anode and cathode poles in said container in contact with said electrolyte, particles of finely divided graphite powder suspended in said electrolyte and a shield is disposed between said anode and cathode poles preventing said particles from contacting said cathode pole, said combination including means for moving said electrolyte with said particles past said anode pole to contact and charge said graphite particles and move said electrolyte with said particles into contact with said conducting layer of said workpiece having a surface of conducting material, so that said charged particles transfer charges to said conducting material to form ions of said conducting material.

11. An apparatus in combination as claimed in claim 10, which includes pump means to circulate electrolyte with said particles past said anode pole and to said workpiece.

12. An apparatus in combination as claimed in claim 10, which includes motor means to move said anode pole relatively to said electrolyte.

\* \* \* \* \*